(12) United States Patent
Barrie et al.

(10) Patent No.: US 8,829,677 B2
(45) Date of Patent: Sep. 9, 2014

(54) SEMICONDUCTOR DIE HAVING FINE PITCH ELECTRICAL INTERCONNECTS

(75) Inventors: Keith Lake Barrie, Santa Cruz, CA (US); Suzette K. Pangrie, Cupertino, CA (US); Grant Villavicencio, Scotts Valley, CA (US); Jeffrey S. Leal, Scotts Valley, CA (US)

(73) Assignee: Invensas Corporation, San Jose, CA (US)

( * ) Notice: Subject to any disclaimer, the term of this patent is extended or adjusted under 35 U.S.C. 154(b) by 142 days.

(21) Appl. No.: 13/243,877

(22) Filed: Sep. 23, 2011

(65) Prior Publication Data

US 2012/0248607 A1 Oct. 4, 2012

Related U.S. Application Data

(60) Provisional application No. 61/393,311, filed on Oct. 14, 2010.

(51) Int. Cl.
| | |
|---|---|
| *H01L 23/28* | (2006.01) |
| *H01L 23/31* | (2006.01) |
| *H01L 21/68* | (2006.01) |
| *H01L 23/00* | (2006.01) |
| *H01L 25/065* | (2006.01) |
| *H01L 23/29* | (2006.01) |

(52) U.S. Cl.
CPC ..... *H01L 23/3185* (2013.01); *H01L 2224/2919* (2013.01); *H01L 24/82* (2013.01); *H01L 2224/16145* (2013.01); *H01L 2924/01029* (2013.01); *H01L 2224/133* (2013.01); *H01L 2924/01019* (2013.01); *H01L 24/05* (2013.01); *H01L 2924/01038* (2013.01); *H01L 2224/0346* (2013.01); *H01L 2924/01033* (2013.01); *H01L 2224/82039* (2013.01); *H01L 2924/0105* (2013.01); *H01L 2224/05147* (2013.01); *H01L 25/0657* (2013.01); *H01L 2224/0345* (2013.01); *H01L 2224/11848* (2013.01); *H01L 2225/06562* (2013.01); *H01L 2224/25175* (2013.01); *H01L 2224/05573* (2013.01); *H01L 2224/24146* (2013.01); *H01L 2924/01082* (2013.01); *H01L 2224/05567* (2013.01); *H01L 2224/05155* (2013.01); *H01L 2224/245* (2013.01); *H01L 2924/01079* (2013.01); *H01L 2224/038* (2013.01); *H01L 2224/24051* (2013.01); *H01L 2224/82009* (2013.01); *H01L 24/25* (2013.01); *H01L 2224/24105* (2013.01); *H01L 2224/13017* (2013.01); *H01L 2224/13347* (2013.01); *H01L 2924/01013* (2013.01); *H01L 23/293* (2013.01); *H01L 2224/24992* (2013.01); *H01L 2224/05644* (2013.01); *H01L 2224/24997* (2013.01); *H01L 2224/05124* (2013.01); *H01L 2224/1131* (2013.01); *H01L 2224/13311* (2013.01); *H01L 2924/01327* (2013.01); *H01L 2224/82101* (2013.01); *H01L 2224/13313* (2013.01); *H01L 2224/1329* (2013.01); *H01L 2225/06524* (2013.01); *H01L 2224/0381* (2013.01); *H01L 2924/01047* (2013.01); *H01L 2924/01006* (2013.01); *H01L 2224/05664* (2013.01); *H01L 24/24* (2013.01); *H01L 2224/24226* (2013.01); *H01L 2224/05022* (2013.01); *H01L 2224/244* (2013.01)
USPC ........... 257/738; 257/781; 257/784; 257/786; 257/777; 257/723

(58) Field of Classification Search
USPC .......... 257/777, 723, E21.503, 738, 781, 784, 257/786
See application file for complete search history.

(56) References Cited

U.S. PATENT DOCUMENTS

| | | | |
|---|---|---|---|
| 5,657,206 | A | 8/1997 | Pedersen et al. |
| 5,661,087 | A | 8/1997 | Pedersen et al. |
| 5,675,180 | A | 10/1997 | Pedersen et al. |
| 5,837,566 | A | 11/1998 | Pedersen et al. |
| 5,891,761 | A | 4/1999 | Vindasius et al. |
| 6,080,596 | A | 6/2000 | Vindasius et al. |
| 6,098,278 | A | 8/2000 | Vindasius et al. |
| 6,124,633 | A | 9/2000 | Vindasius et al. |
| 6,177,296 | B1 | 1/2001 | Vindasius et al. |
| 6,188,126 | B1 | 2/2001 | Pedersen et al. |
| 6,255,726 | B1 | 7/2001 | Vindasius et al. |
| 6,271,598 | B1 | 8/2001 | Vindasius et al. |

| | | | |
|---|---|---|---|
| 6,906,418 B2 * | 6/2005 | Hiatt et al. | 257/738 |
| 6,998,717 B2 * | 2/2006 | Farnworth et al. | 257/777 |
| 7,215,018 B2 | 5/2007 | Vindasius et al. | |
| 7,245,021 B2 | 7/2007 | Vindasius et al. | |
| 7,535,109 B2 | 5/2009 | Robinson et al. | |
| 7,843,046 B2 | 11/2010 | Andrews, Jr. et al. | |
| 7,923,349 B2 | 4/2011 | McElrea et al. | |
| 8,159,053 B2 | 4/2012 | Andrews, Jr. et al. | |
| 8,178,978 B2 | 5/2012 | McElrea et al. | |
| 8,324,081 B2 | 12/2012 | McElrea et al. | |
| 8,357,999 B2 | 1/2013 | Robinson et al. | |
| 2004/0018713 A1 | 1/2004 | Hiatt et al. | |
| 2008/0224279 A1 | 9/2008 | Caskey et al. | |
| 2008/0303131 A1 | 12/2008 | McElrea et al. | |
| 2009/0001588 A1 | 1/2009 | Ranade | |
| 2009/0065916 A1 | 3/2009 | Crane et al. | |
| 2010/0327461 A1 | 12/2010 | Co et al. | |
| 2011/0037159 A1 | 2/2011 | McElrea et al. | |
| 2011/0272825 A1 | 11/2011 | McGrath et al. | |
| 2012/0119385 A1 | 5/2012 | Co et al. | |
| 2012/0248607 A1 | 10/2012 | Barrie et al. | |
| 2013/0099392 A1 | 4/2013 | McElrea et al. | |

OTHER PUBLICATIONS

International Search Report for Application No. PCT/US2011/053294 dated Apr. 23, 2012.

U.S. Appl. No. 12/124,097, filed Mar. 12, 2009.

* cited by examiner

*Primary Examiner* — Zandra Smith

*Assistant Examiner* — Tsz Chiu

(74) *Attorney, Agent, or Firm* — Lerner, David, Littenberg, Krumholz & Mentlik, LLP

(57) ABSTRACT

A die has interconnect pads on an interconnect side near an interconnect edge and has at least a portion of the interconnect side covered by a conformal dielectric coating, in which an interconnect trace over the dielectric coating forms a high interface angle with the surface of the dielectric coating. Because the traces have a high interface angle, a tendency for the interconnect materials to "bleed" laterally is mitigated and contact or overlap of adjacent traces is avoided. The interconnect trace includes a curable electrically conductive interconnect material; that is, it includes a material that can be applied in a flowable form, and thereafter cured or allowed to cure to form the conductive traces. Also, a method includes, prior to forming the traces, subjecting the surface of the conformal dielectric coating with a $CF_4$ plasma treatment.

37 Claims, 3 Drawing Sheets

SEMICONDUCTOR DIE HAVING FINE PITCH ELECTRICAL INTERCONNECTS

CROSS-REFERENCE TO RELATED APPLICATIONS

This application claims priority from K. L Barrie et al. U.S. Provisional Application No. 61/393,311, filed Oct. 14, 2010, titled "Semiconductor die having fine pitch electrical interconnects".

This application is related to S. J. S. McElrea et al. U.S. application Ser. No. 12/124,077, filed May 20, 2008, titled "Electrically interconnected stacked die assemblies"; and T. Caskey et al. U.S. application Ser. No. 12/124,097, filed Mar. 12, 2009, titled "Electrical interconnect formed by pulse dispense". Each application identified herein above or below is incorporated herein by reference.

BACKGROUND

This invention relates to electrical interconnection of integrated circuit chips and, particularly, to interconnection of assemblies including one or more integrated circuit chips.

A typical semiconductor die has a front ("active") side, in which the integrated circuitry is formed, a back side, and sidewalls. The sidewalls meet the front side at front edges and the back side at back edges. Semiconductor die typically are provided with interconnect pads (die pads) located at the front side for electrical interconnection of the circuitry on the die with other circuitry in the device in which the die is deployed. Some die as provided have die pads on the front side along one or more of the die margins, and these may be referred to as peripheral pad die. Other die as provided have die pads arranged in one or two rows at the front side near the center of the die, and these may be referred to as central pad die. The die may be "rerouted" to provide a suitable arrangement of interconnect pads at or near one or more of the margins of the die. A die margin along which interconnect pads are arranged may be referred to as an "interconnect margin", the adjacent front die edge may be referred to as an "interconnect edge", and a die sidewall adjacent an interconnect die edge may be referred to as an "interconnect sidewall".

Semiconductor die may be electrically connected with other circuitry, for example in a printed circuit board, a package substrate or leadframe, or another die, by any of several means. Connection may be made, for example, by wire bonds, or by flip chip interconnects, or by tab interconnects.

T. Caskey et al. U.S. application Ser. No. 12/124,097, filed Mar. 12, 2009, titled "Electrical interconnect formed by pulse dispense", which is incorporated herein by reference, describes electrical interconnection of die by depositing a curable electrically conductive material over the features to be connected and curing the material to form electrically conductive traces. Suitable curable materials include conductive polymers or conductive inks, for example.

A dielectric coating formed over the die surface prior to forming the interconnects surface serves to insulate features that might otherwise be contacted by the electrically conductive traces, but to which electrical contact is not desired, such as the die margins along which the die pads are situated, and the adjacent die edges and sidewalls; and die pads over which the traces may pass, but which are not intended to be electrically connected to other features. The dielectric coating may by any of a variety of materials, and may be formed using any of a variety of techniques as appropriate for the particular material. Suitable materials include organic polymers, and particularly suitable materials include parylenes, which are formed by in situ polymerization of precursor molecules in vapor form. The coating covers all surfaces that are exposed to the material during the coating process, including areas where electrical connection is to be made. Accordingly, openings are formed over selected areas where contact with the conductive traces is desired, for example by selective laser ablation.

A number of approaches have been proposed for increasing the density of active semiconductor circuitry in integrated circuit chip packages, while minimizing package size (package footprint, package thickness). In one approach to making a high density package having a smaller footprint, two or more semiconductor die, of the same or different functionality, are stacked one over another and mounted on a package substrate.

S. J. S. McElrea et al. U.S. application Ser. No. 12/124,077, filed May 20, 2008, titled "Electrically interconnected stacked die assemblies", which is incorporated herein by reference, describes stacked die assemblies having various stacking configurations in which electrical interconnection is made using an interconnect material such as a material that includes a conductive polymer or a conductive ink, for example. In some configurations, for example (among others), each die has interconnect pads situated in a margin along an interconnect edge, and succeeding die in the stack arranged so that their respective interconnect edges face toward the same face of the stack, and the interconnect die edges are offset so that the configuration presents as a stairstep die stack, and the interconnections are made over the steps.

At reduced pad pitch, adjacent traces are close together and, depending on the particular interconnect material and the particular underlying dielectric coating, the interconnect material may "bleed" laterally, so that the edges of adjacent traces meet or overlap, causing electrical leakage between the adjacent traces. Such electrical leakage is not acceptable.

SUMMARY

In one general aspect the invention features an assembly including a die having interconnect pads at interconnect side near an interconnect edge and having at least a portion of the interconnect side covered by a conformal dielectric coating, wherein an interconnect trace over the dielectric coating forms a high interface angle with the surface of the dielectric coating. Because the traces have a high interface angle, a tendency for the interconnect materials to "bleed" laterally is mitigated and contact or overlap of adjacent traces is avoided. The interconnect trace includes a curable electrically conductive interconnect material; that is, it includes a material that can be applied in a flowable form, and thereafter cured or allowed to cure to form the conductive traces.

In some embodiments the interconnect material includes a curable electrically conductive polymer or an electrically conductive ink. In particular embodiments, for example, the interconnect material is an electrically conductive polymer; suitable electrically conductive polymers include polymers filled with conductive material in particle form such as, for example, metal-filled polymers, including for example metal filled epoxy, metal filled thermosetting polymers, metal filled thermoplastic polymers, or an electrically conductive ink. The conductive particles may range widely in size and shape; they may be for example nanoparticles or larger particles. In some embodiments the electrically conductive polymer is a curable polymer, and may be curable in stages. The interconnect material may include, for example, a matrix containing an electrically conductive filler; the matrix may be a curable or settable material, and the electrically conductive fill may be in particulate form, for example, such that when the matrix sets or is cured, the material is itself electrically conductive. In some embodiments the material includes a conductive epoxy such as a silver filled epoxy; for example, a filled epoxy having 60-90% (more usually 80-85%) silver may be suitable. In some embodiments the material includes a The epoxy is cured following dispensing, resulting in some embodiments in a fusion of the series of dots into a continuous interconnect strand.

In some embodiments the surface of the feature to be electrically connected (such as, for example, an interconnect pad on the die or a connection site on the support) may optionally be provided with an element (or elements) which, under the cure conditions, can together with an element (or elements) in the interconnect material, form an intermetallic at the interface of the interconnect material and the pad or site surface. Such intermetallics can result in improved electrical conductivity in the traces and can result in improved continuity between the pad or site and the trace.

Particular examples of suitable interconnect materials include electrically conductive pastes that include an organic polymer with various proportions of particles of Cu, Bi and Sn, or Cu, Bi, Sn and Ag. During cure, these materials can form intermetallics in the trace itself (particularly, for example, CuSn intermetallics) during cure; and .where the surface of the interconnect pad or connection site is provided with gold, for example, these materials can form AuSn intermetallics at the interface of the trace and the surface of the pad or site.

Other particular examples of suitable interconnect materials include silver-filled epoxies.

In some embodiments the material of the conformal dielectric coating includes a nonorganic (inorganic) polymer, which may be a silicon-based polymer; a sol-gel glass deposit may be a suitable inorganic polymer. In some embodiments the material of the conformal coating includes an organic polymer, such as for example a polyimid, a benzocyclobutene (BCB), an epoxy, or a cyanoacrylate. In some embodiments the material of the conformal coating includes a hybrid (inorganic-organic) polymer; a silicon-based polymer combined with an organic polymer may be suitable, for example. In particular embodiments the conformal coating includes a halogenated polymer such as for example a polymer of p-xylene or a derivative thereof, such as a polyxylylene polymer, e.g., a parylene C or a parylene N, or a parylene A, or a parylene SR. In some embodiments the conformal coating is formed by deposition, for example by vapor deposition, or liquid phase deposition, or by solid phase deposition.

In some embodiments the assembly includes two or more die, stacked in an offset (stairstep) configuration and electrically connected. In some embodiments the assembly includes at least one die, or a stack of die, mounted onto and electrically connected to a support such as a substrate.

The interface angle, measured by analogy to a "contact angle" at which a liquid/vapor interface meets a solid surface, may approach or exceed approximately 90° and, in various embodiments, may be in a range between about 60° and about 120°, more usually in a range between about 75° and about 105°, and in particular embodiments in a range between about 75° and about 90°.

In another general aspect the invention features methods for forming the assemblies, including treating the surface of the conformal coating with a $CF_4$ plasma prior to applying the interconnect material over it. Apparently, this procedure reduces the "wettablility" of the interconnect material on the conformal coating surface to the interconnect material. The $CF_4$ plasma treatment may be carried out subsequent to forming openings over selected features (for example, by laser ablation); and usually in such embodiments a plasma clean (for example, an Ar plasma treatment) follows the procedure of forming openings in the dielectric coating, and the CF4 treatment may follow the plasma clean.

The assemblies according to the invention can be used in any electronic system, particularly in a small-format application such as a portable or hand-held device; for example the assemblies can be used for building computers such as personal computers, telecommunications equipment, and consumer and industrial electronics devices.

DETAILED DESCRIPTION

The invention will now be described in further detail by reference to the figures, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs. Also for clarity of presentation certain features are not shown in the FIGs., where not necessary for an understanding of the invention.

Figure 1:
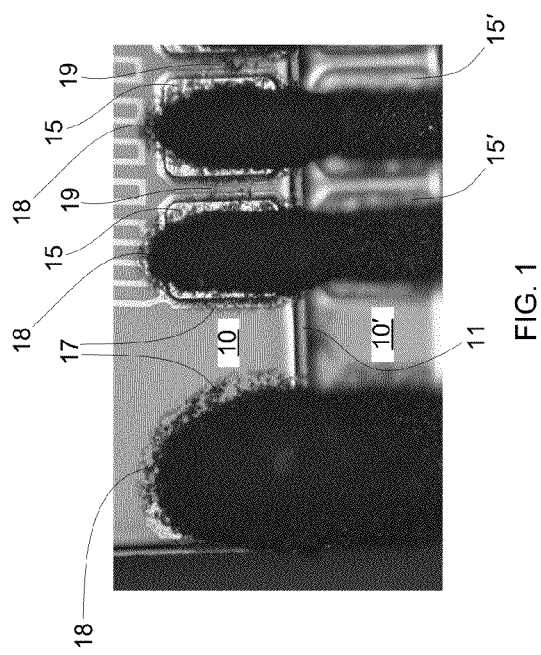
FIG. 1 is a photograph showing electrical interconnects in an overview.

FIG. 1 is a photograph showing a portion of a stack of electrically interconnected die. In the illustrated die stack an upper die 10 is stacked over an underlying lower die 10'. Interconnect pads 15 are arranged along an interconnect edge 11 of the upper die 10, and Interconnect pads 15' are arranged along an interconnect edge (outside the frame of the photograph) of the lower die 10'. In the example shown here the die in the stack are offset; that is, the interconnect edge 11 of the upper die 10 is offset in relation to the interconnect edge of the lower die 10', so that the interconnect pads 15' are revealed. The die in the stack are electrically interconnected by conductive traces 18.

Figure 2B:
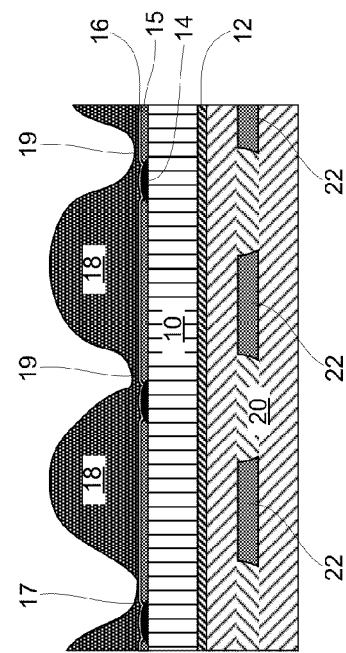
FIG. 2B is a sketch identifying features appearing in the photograph in FIG. 2A.
Figure 2A:
FIG. 2A is a photograph showing electrical interconnects in a sectional view.

FIGS. 2A and 2B show in sectional view a portion of a die mounted on a die attach surface of a substrate and having electrical interconnect traces formed over interconnect pads. FIG. 2A is a photograph, and FIG. 2B is a sketch made by tracing over the photograph, to aid in identifying certain features. As is conventional, integrated circuitry in an active side of the die is electrically connected to interconnect pads on an interconnect surface of the die. (Some of the circuitry in and on the die is outside the frame of the photograph, and details of the circuitry in or on the die is omitted from the FIGs.) The interconnect surface of the die is conventionally covered with a passivation layer, which is patterned (for example by a mask-and-etch procedure) to expose the die surface; and interconnect pads (and electrical traces leading to them) are conventionally formed by forming a metal layer over the passivated interconnect surface of the die, and then patterning the metal layer (for example by a mask-and-etch procedure). The die is oriented in relation to the substrate such that the interconnect surface of the die faces away from the die mount surface of the substrate.

Referring now to FIG. 2B, the die 10 is mounted on the substrate 20 using an adhesive 12 such as a die attach film. As is conventional, the substrate is provided with pads exposed at the die attach surface, for electrical connection of the die with the substrate circuitry. (Some of the circuitry on and in the substrate is outside the frame of the photograph, and details of the circuitry on and in the substrate are omitted from the FIGs.) The portion of the substrate 20 shown here includes layers of a dielectric material and a patterned metal layer or metallization 22.

The die 10 has interconnect pads 15 formed at the die surface. The die surface between the pads 15 is covered by a passivation 14, and an electrically insulative conformal coating 16 is formed over the pads 15 and the passivation 14. The passivation 14 may be, for example, an inorganic dielectric such as an inorganic oxide, e.g., a silicon oxide; or, for example, an organic dielectric polymer, e.g., a polyimid, or a parylene. The electrically insulative conformal coating 16 may be, for example, an organic dielectric polymer, such as a parylene. In a particular example the conformal dielectric coating is a parylene.

Openings through the insulative conformal coating are formed (for example, by laser ablation) to expose features where electrical contact with a later-formed overlying trace is desired. (Openings through the conformal coating are not shown in FIG. 2B, as they do not appear in FIG. 2A; either there are no opening in the particular pads shown, or else any openings are outside the frame of the photograph.) The interconnect die pads may include a metal, for example, and may in particular examples include one or more metals such as aluminum, or copper, or gold, for example. In particular embodiments a gold or palladium contact surface may be preferred, and in such embodiments the die pads may be either gold or another metal treated (for example, by a plating or sputtering procedure) to have a gold or palladium contact surface. In some embodiments a palladium contact surface is formed by plating or sputtering the pad with nickel and then with palladium.

In a particular example, the die pads include gold at the contact surface.

In the example shown, interconnect traces 18 are formed of a conductive material that is applied in flowable form, and then cured or allowed to cure to complete the traces.

Such materials include, for example, electrically conductive polymers, including electrically conductive particulates (e.g., conductive metal particles) contained in a curable organic polymer matrix (for example, conductive (e.g., filled) epoxies, or electrically conductive inks); and include, for example, electrically conductive particulates delivered in a liquid carrier. In particular embodiments the interconnect material is a conductive polymer such as a curable conductive polymer, or a conductive ink.

For example, the conductive material can include electrically conductive particles in a curable polymer matrix. In a particular example, the conductive material includes particles of Bismuth, Copper, and Tin in an epoxy matrix.

As indicated at 19 in FIGS. 1 and 2B, and as appears in FIG. 2A, although the traces have a generally semicircular cross-section, the interconnect material adjacent the pad surface in these examples has spread at the edges and, in at least some instances the edges of adjacent traces contact or overlap. This can result in electrical leakage between adjacent traces, which is an unacceptable condition.

We have discovered that a plasma treatment of the conformal dielectric coating surface using $CF_4$ prior to formation of the traces can mitigate the tendency of the interconnect material adjacent the pad surface to spread at the edges. An example of a resulting structure is presented in FIGS. 3, 4A, and 4B. The materials are substantially similar to those used in the examples of FIGS. 1, 2A, and 2B; and the process for making the examples was substantially similar, except that here a $CF_4$ plasma treatment preceded the process of forming the traces.

Figure 3:
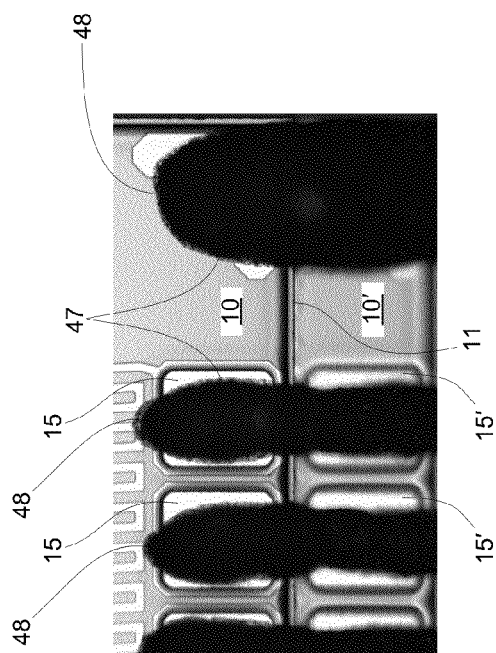
FIG. 3 is a photograph showing improved electrical interconnects in an overview.
Figure 4A:
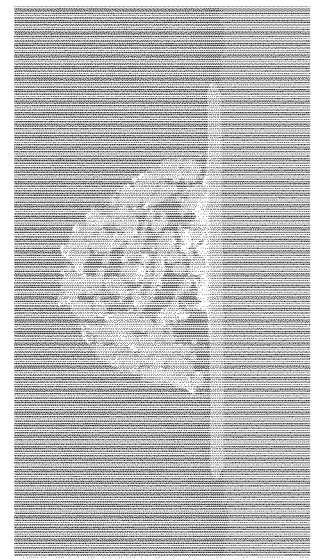
FIG. 4A is a photograph showing an improved electrical interconnect in a sectional view.
Figure 4B:
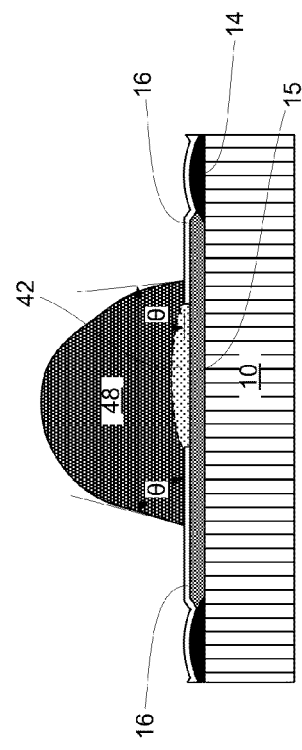
FIG. 4B is a sketch identifying features appearing in the photograph in FIG. 4A.

In the overview shown in the photograph in FIG. 3, the traces 48 can be seen to be well-confined, with only slight "feathering" at the edges 47. As seen in a sectional view in the photograph of FIG. 4A, and as sketched in FIG. 4B, the traces display a high interface angle $\theta$ at the intersection of the trace material and the pad surface, and very little or no "run out" or "bleed" of the interconnect material at the edges adjacent the pad surface. In these FIGs. example an opening is shown in the conformal dielectric coating, allowing contact of the interconnect material with the pad surface, and formation of an intermetallic 42 at the interface of the interconnect material and the pad.

Figure 5:
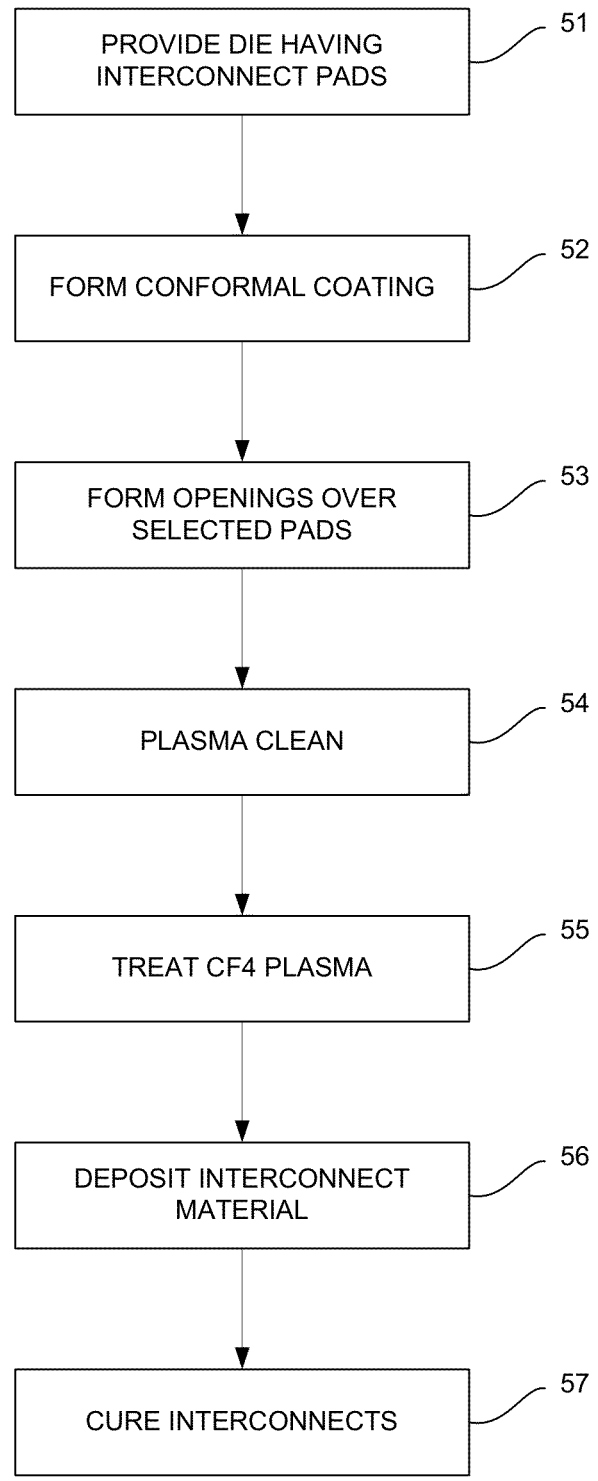
FIG. 5 is a flow diagram showing stages in a process for making improved electrical interconnects.

FIG. 5 shows stages in a process for making improved interconnects.

In a stage 51, a die is provided having interconnect pads at an interconnect side; or a stack of die is provided having interconnect pads at an interconnect side. Any of a variety of die types may be treated according to embodiments of the invention; and where a stack of die is provided, the die may be arranged in any of a variety of stack configurations.

Examples of various stack configurations are described, for example, in U.S. application Ser. No. 12/124,077, referenced above and incorporated herein by reference.

In some stack configurations, for example, each die has interconnect pads situated in a margin along at least a first die edge, and succeeding die in the stack may be arranged so that their respective first die edges ("interconnect die edges") face toward the same face of the stack (the "interconnect stack face"). In some such stack arrangements the interconnect edges are all generally vertically aligned over one another; that is, the interconnect stack face is generally planar and perpendicular to a plane (arbitrarily a "horizontal" plane) of the top and bottom stack surface. In other such stack arrangements each die in the stack is offset in relation to an underlying die, exposing a portion of the interconnect margin of the underlying die. This configuration presents as a "stairstep" die stack, and the interconnections can be made over the "steps." In other embodiments, for example, each die has interconnect margins along at least a first die edge, but succeeding die in the stack are arranged so that their respective first die edges face toward a different (e.g., opposite) face of the stack. Where the first die edges face toward an opposite stack face, this configuration presents as a "staggered" die stack, where (numbering the die sequentially from the bottom of the stack) the first die edges of odd-numbered die face toward one stack face and the first die edges of even-numbered die face toward the opposite stack face. In a staggered stack, the first die edges of the odd-numbered die are vertically aligned at one stack face, and corresponding overlying pads can be connected by a vertical interconnect; and the even-numbered die are vertically aligned at the opposite stack face, and corresponding overlying pads can be connected by another vertical interconnect. In the staggered stack configuration the even-numbered die serve as spacers between the odd-numbered die, and the odd-numbered die act as spacers between the even-numbered die. Because the spaces between the die are comparatively high, (approximately the thickness of the interposed die), the interconnect traces are formed to traverse portions of the interconnect distance unsupported. In still other embodiments, for example, die having an X-dimension greater than a Y-dimension are stacked, with succeeding die in the stack oriented at 90° in relation to vertically adjacent die below or above. In such embodiments each die has interconnect pads situated in a margin along at least a first narrower die edge (typically along both narrower die edges), and (numbering the die sequentially from the bottom of the stack) the first die edge of the even-numbered die may face toward one face of the stack, and the first die edge of the odd-numbered die may face toward a second stack face, at 90° to the first stack face. In any of these embodiments each die may additionally have interconnect pads situated in a margin along a second die edge in addition to the first, and the second die edge may be an opposite edge or an adjacent (at 90°) die edge.

Some stack configurations include arrangements in which the die in the stack have the same length and width dimensions, and/or arrangements in which not all the die in the stack have the same length or the same width dimensions. In some offset die stacks at least one die may have a smaller length or width dimension than an underlying die, and these may present as a "pyramid", as viewed toward at least two opposite ones of the stack faces.

Inasmuch as the interconnect material will be substantially conformal with the surfaces on which it is deposited, any such surfaces may make electrical contact with the conductive trace, except where the surfaces are electrically insulated. Accordingly surfaces of the die that may contact the interconnect traces, and at which no electrical contact is desired, should be electrically insulated. This may be accomplished, for example, by applying a conformal dielectric film over the surfaces as in a stage 52, and then forming openings in the film where electrical contact is desired as in a stage 53. In some embodiments the material of the conformal coating includes a film of an organic polymer, for example a polymer of p-xylene or a derivative thereof, such as a polyxylylene polymer, e.g., a parylene C or a parylene N, or a parylene A, or a parylene SR. In some embodiments the conformal coating is formed by deposition, for example by vapor deposition, or liquid phase deposition, or by solid phase deposition.

A particularly suitable dielectric film is a parylene film, and the film may be applied to the die prior to assembly in a stack; or after assembly but prior to forming one or more of the interconnect traces.

The dielectric conformal coating is formed to a thickness sufficient to provide a continuous coating (free of pinholes), and sufficient to provide electrical insulation with a dielectric strength that meets or exceeds the requirements of the underlying circuitry. Parylene coating thicknesses in a range about 1 um to about 5 um may be suitable, for example. Parylene coating may be carried out using standard parylene apparatus.

After the coating is complete, the wafer is removed from the parylene chamber and a laser ablation system is used to remove the coating from the selected features (such as, for example, interconnect die pads to be electrically interconnected). As may be appreciated, the laser must be operated at a wavelength at which there is appreciable energy absorption in the coating layer, considering that parylene is substantially transparent in the visible range between 300 and 800 nanometers. Optionally, the removal of coating material from the pads may be carried out at a later stage, at any time up to the time electrical connection of the die is to be carried out.

The laser ablation procedure is typically followed by a plasma clean, in a stage 54, such as an Ar plasma treatment, as may be conventionally employed.

Subsequently in a stage 55, a $CF_4$ plasma treatment is carried out. The following parameters may be suitable:

$CF_4$%: in a range about 5% to about 100%;
Power: in a range about 100 to about 800 watts;
Pressure: in a range about 50 millitorr to about 500 millitorr;
Time: in a range about 10 seconds to about 30 minutes;
Flow Rate: in a range about 100 sccm to about 2000 sccm.

In a particular example, the following parameters were employed: 100% $CF_4$, run at 400 watts at a pressure of 200 millitorr for 60 seconds, at a flow rate of 250 sccm.

The $CF_4$ treatment can be carried out in steps as follows: in a 2-step procedure, an Ar plasma clean is followed by a $CF_4$ treatment. Optionally, in one 3-step procedure, an Ar plasma clean is followed by a N plasma treatment, which is then followed a $CF_4$ treatment; in an alternative 3-step procedure, an Ar plasma clean is followed by a $CF_4$ treatment. which is followed by a second Ar plasma treatment (to back off the result of the $CF_4$ treatment to some extent).

As will be appreciated, the parameters would be optimized for the particular interconnect material and conformal dielectric material; and such optimization can readily be done without undue experimentation.

The CF4 treatment is followed by a procedure 56 of depositing the interconnect material, and thereafter the interconnect material is cured or allowed to cure, at a stage 57, to form the interconnect traces.

Other embodiments are within the claims.

We claim:

1. An assembly comprising:
   a semiconductor die having interconnect pads at an interconnect side near an interconnect edge and having at least a portion of the interconnect side covered by a conformal dielectric coating,
   wherein an electrically conductive interconnect trace over the dielectric coating forms a high interface angle with the surface of the dielectric coating, the interconnect trace formed of an interconnect material comprising a polymer,
   wherein the interconnect trace extends in a lateral direction beyond the interconnect edge of the semiconductor die relative to at least one of the interconnect pads and electrically interconnects the at least one interconnect pad with another electrically conductive element.

2. The assembly of claim 1 wherein the interconnect material comprises a curable interconnect material.

3. The assembly of claim 1, comprising a plurality of said die, stacked and electrically connected by a plurality of the interconnect traces, wherein each interconnect trace is electrically interconnected with at least one interconnect pad of at least two die of the plurality of semiconductor die.

4. The assembly of claim 1, wherein the semiconductor die is one of a plurality of die in a stack of die, mounted onto and electrically connected to circuitry on a support by a plurality of the interconnect traces, wherein each interconnect trace is electrically interconnected with at least one interconnect pad of a die of the plurality of semiconductor die and the circuitry on the support.

5. The assembly of claim 1 wherein the conformal coating comprises a polymer material.

6. The assembly of claim 5 wherein the polymer material of the conformal coating comprises a nonorganic polymer.

7. The assembly of claim 5 wherein the polymer material of the conformal coating comprises an organic polymer.

8. The assembly of claim 5 wherein the polymer material of the conformal coating comprises a hybrid polymer.

9. The assembly of claim 7 wherein the polymer material of the conformal coating comprises a parylene.

10. The assembly of claim 9 wherein the polymer material of the conformal coating comprises one or a combination of a parylene C, a parylene N, a parylene A, or a parylene SR.

11. The assembly of claim 1 wherein the interconnect material comprises a curable electrically conductive polymer or an electrically conductive ink.

12. The assembly of claim 1 wherein the interconnect material comprises a polymer filled with conductive material in particle form.

13. The assembly of claim 1 wherein the interconnect material comprises a metal-filled polymer.

14. The assembly of claim 1 wherein the interconnect material comprises a metal-filled epoxy.

15. The assembly of claim 1 wherein the interconnect material comprises a metal-filled thermosetting polymer.

16. The assembly of claim 1 wherein the interconnect material comprises a metal-filled thermoplastic polymer.

17. The assembly of claim 1 wherein the interconnect material comprises an organic polymer.

18. The assembly of claim 1 wherein the interconnect material comprises an inorganic polymer.

19. The assembly of claim 1 wherein the interconnect material comprises a hybrid organic- inorganic polymer.

20. The assembly of claim 1 wherein the interconnect material comprises an electrically conductive ink.

21. The assembly of claim 1 wherein the interconnect material comprises a curable polymer.

22. The assembly of claim 21 wherein the curable polymer is curable in stages.

23. The assembly of claim 1 wherein the interconnect material comprises a matrix containing an electrically conductive filler.

24. The assembly of claim 23 wherein the interconnect matrix comprises a curable or settable material, and the electrically conductive filler comprises an electrically conductive metal in particulate form.

25. The assembly of claim 1 wherein the interconnect material comprises an electrically conductive epoxy.

26. The assembly of claim 1 wherein the interconnect material comprises a silver filled epoxy.

27. The assembly of claim 1 wherein the interconnect material comprises a filled epoxy having 60-90% by weight of silver.

28. The assembly of claim 1 wherein the interconnect material comprises a filled epoxy having 80-85% by weight of silver.

29. The assembly of claim 1 wherein interface angle is in a range between about 60° and about 120°.

30. The assembly of claim 29 wherein interface angle is in a range between about 75° and about 105°.

31. The assembly of claim 29 wherein interface angle is in a range between about 75° and about 90°.

32. The assembly of claim 3, wherein at least one of the electrically interconnected pads of a die in the stack is disposed beyond the interconnect edge of the die disposed directly above such die.

33. The assembly of claim 3, wherein the at least one interconnect pad of an underlying die is exposed beyond an interconnect edge of another die in the stack above the underlying die.

34. The assembly of claim 33, wherein the at least one interconnect pad of the underlying die is situated in a portion of an interconnect margin along an interconnect edge of the underlying die, and the portion of the interconnect margin is exposed beyond the interconnect edge of the another die in the stack.

35. The assembly of claim 4, wherein at least one of the electrically interconnected pads of a die in the stack is disposed beyond the interconnect edge of the die disposed directly above such die.

36. The assembly of claim 4, wherein the at least one interconnect pad of an underlying die is exposed beyond an interconnect edge of another die in the stack above the underlying die.

37. The assembly of claim 36, wherein the at least one interconnect pad of the underlying die is situated in a portion of an interconnect margin along an interconnect edge of the underlying die, and the portion of the interconnect margin is exposed beyond the interconnect edge of the another die in the stack.

* * * * *

UNITED STATES PATENT AND TRADEMARK OFFICE
CERTIFICATE OF CORRECTION

| | | |
|---|---|---|
| PATENT NO. | : 8,829,677 B2 | Page 1 of 1 |
| APPLICATION NO. | : 13/243877 | |
| DATED | : September 9, 2014 | |
| INVENTOR(S) | : Keith L. Barrie et al. | |

It is certified that error appears in the above-identified patent and that said Letters Patent is hereby corrected as shown below:

ON THE TITLE PAGE:

(75) Inventors: "Pangrie" should read --Pangrle--.

Signed and Sealed this
Twenty-fourth Day of March, 2015

Michelle K. Lee
*Director of the United States Patent and Trademark Office*